(12) United States Patent
Seeman et al.

(10) Patent No.: US 11,356,087 B2
(45) Date of Patent: Jun. 7, 2022

(54) METHOD AND CIRCUITRY FOR CONTROLLING A DEPLETION-MODE TRANSISTOR

(71) Applicant: TEXAS INSTRUMENTS INCORPORATED, Dallas, TX (US)

(72) Inventors: Michael Douglas Seeman, San Jose, CA (US); Sandeep R. Bahl, Palo Alto, CA (US); David I. Anderson, Saratoga, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/173,981

(22) Filed: Feb. 11, 2021

(65) Prior Publication Data
US 2021/0167767 A1    Jun. 3, 2021

Related U.S. Application Data

(60) Division of application No. 15/702,493, filed on Sep. 12, 2017, now abandoned, which is a continuation of
(Continued)

(51) Int. Cl.
*H03K 17/08* (2006.01)
*H03K 17/082* (2006.01)
(Continued)

(52) U.S. Cl.
CPC .......... *H03K 17/0822* (2013.01); *H02H 3/00* (2013.01); *H03K 3/012* (2013.01); *H03K 17/08* (2013.01);
(Continued)

(58) Field of Classification Search
CPC ....... H03K 17/0882; H03K 17/08; H02H 3/00
See application file for complete search history.

(56) References Cited

U.S. PATENT DOCUMENTS

| 3,870,901 A | 3/1975 | Smith et al. |
| 3,988,616 A | 10/1976 | Shimada |
(Continued)

FOREIGN PATENT DOCUMENTS

| CN | 101689348 A | 3/2010 |
| DE | 102006029928 B3 | 9/2007 |
(Continued)

OTHER PUBLICATIONS

DE102006029928 Machine Translation (10 pages).
(Continued)

*Primary Examiner* — Adi Amrany
(74) *Attorney, Agent, or Firm* — Michael A. Davis., Jr.; Charles A. Brill; Frank D. Cimino

(57) ABSTRACT

In described examples, a first transistor has: a drain coupled to a source of a depletion-mode transistor; a source coupled to a first voltage node; and a gate coupled to a control node. A second transistor has: a drain coupled to a gate of the depletion-mode transistor; a source coupled to the first voltage node; and a gate coupled through at least one first logic device to an input node. A third transistor has: a drain coupled to the gate of the depletion-mode transistor; a source coupled to a second voltage node; and a gate coupled through at least one second logic device to the input node.

40 Claims, 1 Drawing Sheet

Related U.S. Application Data application No. 14/542,962, filed on Nov. 17, 2014, now Pat. No. 9,762,230.

(60) Provisional application No. 61/904,777, filed on Nov. 15, 2013.

(51) Int. Cl.
*H03K 17/10* (2006.01)
*H02H 3/00* (2006.01)
*H03K 3/012* (2006.01)
*H03K 17/687* (2006.01)

(52) U.S. Cl.
CPC ... *H03K 17/102* (2013.01); *H03K 2017/0806* (2013.01); *H03K 2017/6875* (2013.01)

(56) References Cited

U.S. PATENT DOCUMENTS

| | | | |
|---|---|---|---|
| 3,995,172 | A | 11/1976 | Freeman et al. |
| 4,042,839 | A | 8/1977 | Araki |
| 4,064,405 | A | 12/1977 | Cricchi et al. |
| 4,093,875 | A | 6/1978 | Knepper |
| 4,525,640 | A | 6/1985 | Boyle et al. |
| 4,553,045 | A | 11/1985 | Murotani |
| 4,858,180 | A | 8/1989 | Murdoch |
| 6,055,191 | A | 4/2000 | Sher et al. |
| 6,351,360 | B1 | 2/2002 | Kotowski et al. |
| 6,362,943 | B1 | 3/2002 | Galecki et al. |
| RE40,844 | E | 7/2009 | Yang |
| 8,018,694 | B1 | 9/2011 | Wu |
| 8,649,198 | B2 | 2/2014 | Kuzumaki et al. |
| 2010/0052052 | A1 | 3/2010 | Lotfi et al. |
| 2010/0067270 | A1 | 3/2010 | Odell |
| 2012/0008238 | A1 | 1/2012 | Thiele |
| 2012/0154014 | A1 | 6/2012 | Nakashima |
| 2012/0293219 | A1 | 11/2012 | Bai et al. |
| 2013/0070487 | A1 | 3/2013 | Ozawa et al. |
| 2013/0241520 | A1 | 9/2013 | Kim et al. |
| 2013/0241601 | A1 | 9/2013 | Chen et al. |
| 2013/0265028 | A1 | 10/2013 | Choi et al. |
| 2015/0294733 | A1 | 10/2015 | Tan et al. |
| 2016/0172999 | A1 | 6/2016 | Fogg |

FOREIGN PATENT DOCUMENTS

| | | |
|---|---|---|
| DE | 102010046539 A1 | 3/2012 |
| EP | 2164061 A1 | 3/2010 |
| EP | 2477220 A2 | 7/2012 |
| JP | H10233506 | 9/1998 |
| JP | 2011010487 | 1/2011 |
| JP | 201378111 A | 4/2013 |

OTHER PUBLICATIONS

DE102010046539 Machine Translation (7 pages).

Seeman, M.D. et al.; "Advantages of GaN in a high-voltage resonant LLC converter"; IEEE Applied Power Electronics Conference and Exposition (APEC), pp. 476-483, Mar. 16-20, 2014.

Ye, Zhong, et al; "GaN FET-Based CCM Totem-Pole Bridgeless PFC"; Published by Texas Instruments; Sep. 2014; 30 pages.

Karl Norling et al., "An Optimized Driver for SiC JFET-Based Switches Delivering More Than 99% Efficiency", 2012 IEEE International Solid-State Circuits Conference pp. 284-286.

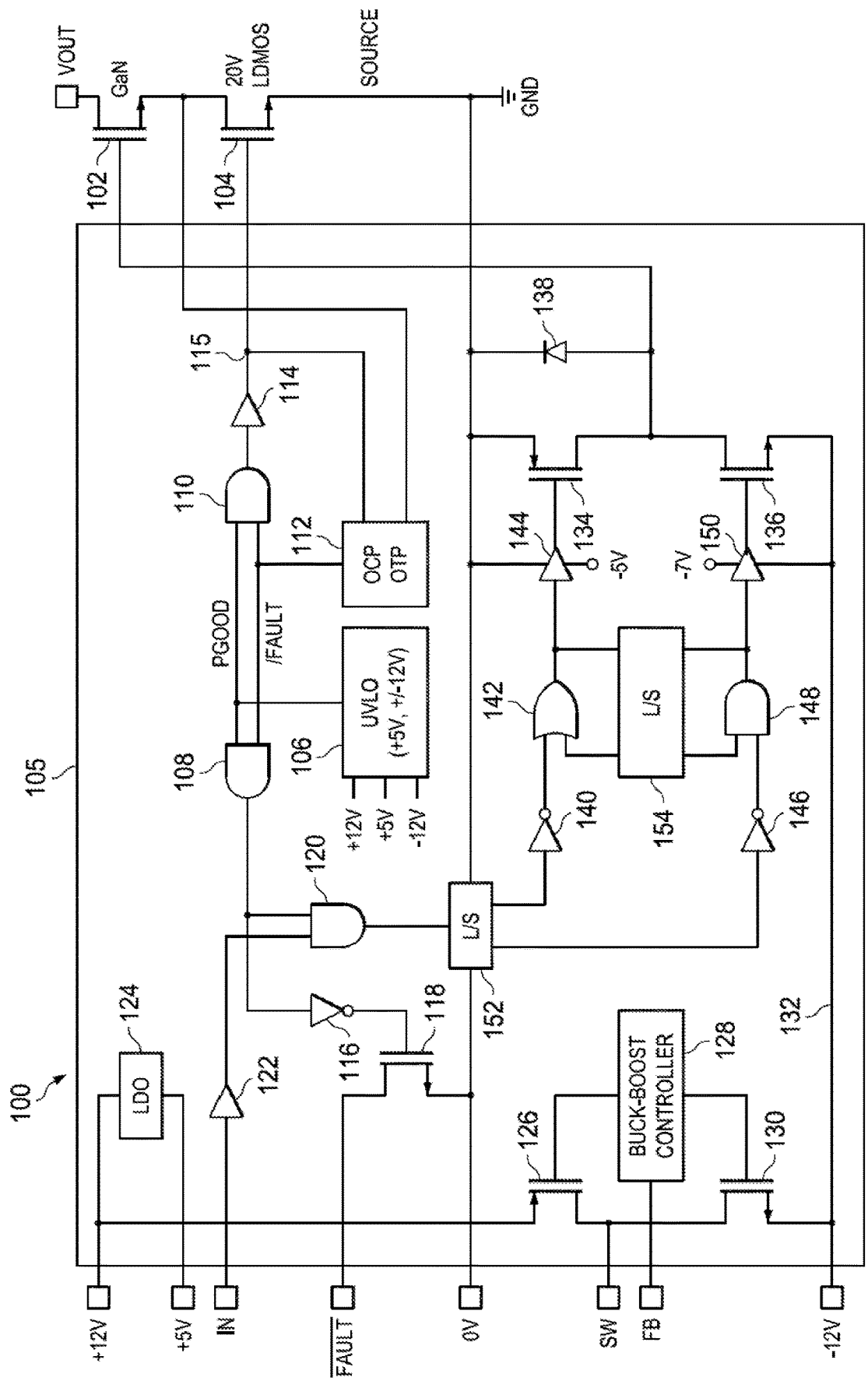

METHOD AND CIRCUITRY FOR CONTROLLING A DEPLETION-MODE TRANSISTOR

CROSS-REFERENCE TO RELATED APPLICATION

This application is a divisional of prior application Ser. No. 15/702,493, filed Sep. 12, 2017;

Which was a continuation of U.S. patent application Ser. No. 14/542,962 filed Nov. 17, 2014, now U.S. Pat. No. 9,762,230, granted Sep. 12, 2017;

Which claims priority to U.S. Provisional Patent Application Ser. No. 61/904,777, filed Nov. 15, 2013, both of which are hereby fully incorporated herein by reference for all purposes.

BACKGROUND

This relates generally to electronic circuitry, and more particularly to a method and circuitry for controlling a depletion-mode transistor.

In many situations, depletion-mode ("d-mode") transistors, such as gallium nitride ("GaN") high-electron-mobility transistors ("HEMTs") and silicon carbide ("SiC") junction gate field-effect transistors ("JFETs"), have switching performance that is superior to enhancement-mode ("e-mode") transistors. Nevertheless, in some power electronic circuit implementations, a normally "on" d-mode transistor (e.g., whose $V_{GS}$=0V) may raise concerns about safety. By comparison, a normally "off" e-mode transistor may help to substantially prevent cross-conduction (such as short circuiting) in response to certain fault conditions.

SUMMARY

In described examples, a first transistor has: a drain coupled to a source of a depletion-mode transistor; a source coupled to a first voltage node; and a gate coupled to a control node. A second transistor has: a drain coupled to a gate of the depletion-mode transistor; a source coupled to the first voltage node; and a gate coupled through at least one first logic device to an input node. A third transistor has: a drain coupled to the gate of the depletion-mode transistor; a source coupled to a second voltage node; and a gate coupled through at least one second logic device to the input node.

BRIEF DESCRIPTION OF THE DRAWINGS

FIG. 1 is a schematic electrical circuit diagram of circuitry of the example embodiments.

DETAILED DESCRIPTION OF EXAMPLE EMBODIMENTS

FIG. 1 is a schematic electrical circuit diagram of circuitry 100 of the example embodiments. As shown in FIG. 1, a high-voltage d-mode transistor 102, such as a GaN HEMT, is connected in series with a low-voltage e-mode NFET ("LV switch") 104. In a first example, the LV switch 104 is discrete. In a second example, the LV switch 104 is integrated with another component (such as being integrated with driver circuitry 105).

A drain of the d-mode transistor 102 is connected to a voltage output node VOUT whose voltage may range up to 600 volts (or beyond). A source of the d-mode transistor 102 is connected to a drain of the LV switch 104. A source of the LV switch 104 is connected to a voltage reference node, such as a ground node GND whose voltage is 0 volts. In at least one example, the ground node GND is connected to a local ground instead of a global ground.

The LV switch 104: (a) turns on for normal operation, so that n-channel metal oxide semiconductor ("NMOS") switching dynamics are substantially removed from overall switching dynamics of the circuitry 100 during normal operation; and (b) turns off for safety (such as device protection) in response to one or more detected fault conditions (such as during startup). Examples of such fault conditions are under-voltage, over-voltage, over-current, and over-temperature.

For example, in response to voltages at the +12 V, +5 V and −12 V nodes, under-voltage lockout ("UVLO") circuitry 106 detects: (a) whether an under-voltage condition exists or is absent; and (b) whether an over-voltage condition exists or is absent. In response to such detection, the UVLO circuitry 106 outputs a signal on a PGOOD line to respective first inputs of AND gates 108 and 110. Accordingly, in response to the UVLO circuitry 106 detecting neither an under-voltage condition nor an over-voltage condition, the signal from the UVLO circuitry 106 on the PGOOD line has a binary logic 1 ("true") state. Conversely, in response to the UVLO circuitry 106 detecting either an under-voltage condition or an over-voltage condition, the signal from the UVLO circuitry 106 on the PGOOD line has a binary logic 0 ("false") state.

Similarly, in response to voltages at a gate of the LV switch 104 and at the drain of the LV switch 104, over-current protection ("OCP") over-temperature protection ("OTP") circuitry 112 detects: (a) whether an over-current condition exists or is absent; and (b) whether an over-temperature condition exists or is absent. In response to such detection, the OCP OTP circuitry 112 outputs a signal on a /FAULT line to respective second inputs of the AND gates 108 and 110. Accordingly, in response to the OCP OTP circuitry 112 detecting neither an over-current condition nor an over-temperature condition, the signal from the OCP OTP circuitry 112 on the /FAULT line has a binary logic 1 ("true"=no fault) state. Conversely, in response to the OCP OTP circuitry 112 detecting either an over-current condition or an over-temperature condition, the signal from the OCP OTP circuitry 112 on the /FAULT line has a binary logic 0 ("false"=fault) state. The OCP OTP circuitry 112 and the UVLO circuitry 106 are examples of fault detection circuitry.

An output of the AND gate 110 is coupled through a buffer 114 to a control node 115. The control node 115 is coupled to the gate of the LV switch 104. Accordingly, if the signal on the PGOOD line has the true state, and if the signal on the /FAULT line has the true state, then the output of the AND gate 110 has the true state, and the LV switch 104 turns on for normal operation. Conversely, if the signal on the PGOOD line has the false state, or if the signal on the /FAULT line has the false state, then the output of the AND gate 110 has the false state, and the LV switch 104 turns off for safety in response to one or more of those detected fault conditions.

Similarly, an output of the AND gate 108 is coupled through an inverter 116 to a gate of an n-channel field-effect transistor ("NFET") 118. A source of the NFET 118 is connected to the ground node GND, and a drain of the NFET 118 is connected to a $\overline{\text{FAULT}}$ node. Accordingly, if the signal on the PGOOD line has the true state, and if the signal on the /FAULT line has the true state, then the output of the AND gate 108 has the true state, so the NFET 118 turns off.

Conversely, if the signal on the PGOOD line has the false state, or if the signal on the /FAULT line has the false state, then the output of the AND gate 108 has the false state, thereby turning on the NFET 118. By turning on the NFET 118, the $\overline{\text{FAULT}}$ node is coupled through the NFET 118 to 0 volts, which thereby communicates (via the $\overline{\text{FAULT}}$ node) existence of one or more of those detected fault conditions.

Also, the output of the AND gate 108 is connected to a first input of an AND gate 120. An input node IN is coupled through a buffer 122 to a second input of the AND gate 120. Thus, if the input node IN has a binary logic 0 ("false") state, then an output of the AND gate 120 has the false state.

For normal operation, the input node IN receives a pulse width modulated ("PWM") signal (such as from a PWM controller), which alternates between a binary logic 1 ("true") state and a binary logic 0 ("false") state. Accordingly, during normal operation: (a) if the signal on the PGOOD line has the true state, and if the signal on the /FAULT line has the true state, then the logic state of the input node IN propagates through the AND gate 120, so the output of the AND gate 120 has the same logic (either true or false) state as the input node IN; and (b) conversely, if the signal on the PGOOD line has the false state, or if the signal on the /FAULT line has the false state, then the output of the AND gate 120 has the false state.

In response to a 12-volt input voltage at a node ("+12 V node"), a low-dropout ("LDO") regulator 124 generates a 5-volt voltage at a node ("+5 V node"). The +12 V node is connected to a source of a p-channel field-effect transistor ("PFET") 126. An inverting buck-boost controller 128 is connected to a gate of the PFET 126 and to a gate of an NFET 130. A source of the NFET 130 is connected to a line 132. A switch node SW is connected to a drain of the PFET 126 and to a drain of the NFET 130. In at least one example, an inductor (not shown for clarity) is connected between the switch node SW and the ground node GND whose voltage is 0 volts. Accordingly, in response to signals (such as voltage signals) at a feedback node FB, the controller 128 controls switching (between on and off) of the PFET 126 and NFET 130 to regulate a voltage of −12 volts on the line 132. In another example, the controller 128 is replaced by an inverting charge pump to regulate the voltage of −12 volts on the line 132 ("−12 V node").

A gate of the d-mode transistor 102 is connected to a drain of a PFET 134 and to a drain of an NFET 136. A source of the PFET 134 is connected to the ground node GND whose voltage is 0 volts, and a source of the NFET 136 is connected to the line 132 whose voltage is −12 volts. A body diode 138 of the PFET 134 is connected from the drain of the PFET 134 to the source of the PFET 134.

For an inverter 140, an OR gate 142 and a buffer 144, a binary logic 0 ("false") state is represented by −5 volts, and a binary logic 1 ("true") state is represented by 0 volts. For an inverter 146, an AND gate 148 and a buffer 150, a binary logic 0 ("false") state is represented by −12 volts, and a binary logic 1 ("true") state is represented by −7 volts.

A level shifter (L/S) 152: (a) receives the output of the AND gate 120; and (b) converts such output to corresponding signals that are suitable for the inverters 140 and 146. Accordingly, in response to the output of the AND gate 120 having the false state, the L/S 152 outputs: (a) to an input of the inverter 140, a signal whose voltage is −5 volts; and (b) to an input of the inverter 146, a signal whose voltage is −12 volts. Conversely, in response to the output of the AND gate 120 having the true state, the L/S 152 outputs: (a) to the input of the inverter 140, a signal whose voltage is 0 volts; and (b) to the input of the inverter 146, a signal whose voltage is −7 volts.

An output of the inverter 140 is connected to a first input of the OR gate 142. An output of the OR gate 142 is connected to an input of the buffer 144. An output of the buffer 144 is connected to a gate of the PFET 134.

An output of the inverter 146 is connected to a first input of the AND gate 148. An output of the AND gate 148 is connected to an input of the buffer 150. An output of the buffer 150 is connected to a gate of the NFET 136.

A level shifter (L/S) 154: (a) receives the output of the AND gate 148; and (b) converts such output to a corresponding signal that is suitable for the OR gate 142. Accordingly: (a) in response to the output of the AND gate 148 having the false state (−12 volts), the L/S 154 outputs (to a second input of the OR gate 142) a signal whose voltage is −5 volts; and (b) conversely, in response to the output of the AND gate 148 having the true state (−7 volts), the L/S 154 outputs (to the second input of the OR gate 142) a signal whose voltage is 0 volts.

Similarly, the level shifter (L/S) 154: (a) receives the output of the OR gate 142; and (b) converts such output to a corresponding signal that is suitable for the AND gate 148. Accordingly: (a) in response to the output of the OR gate 142 having the false state (−5 volts), the L/S 154 outputs (to a second input of the AND gate 148) a signal whose voltage is −12 volts; and (b) conversely, in response to the output of the OR gate 142 having the true state (0 volts), the L/S 154 outputs (to the second input of the AND gate 148) a signal whose voltage is −7 volts.

In that manner, the respective outputs of the inverters 140 and 146 have the same binary logic state as one another, and such logic state is latched by the respective outputs of the OR gate 142 and the AND gate 148.

In at least one embodiment, a threshold voltage ($V_T$) of the d-mode transistor 102 is −10 volts, so the gate of the d-mode transistor 102 operates from a negative potential relative to the source of the LV switch 104. For example, during normal operation, the circuitry 100 is operable to actively switch the gate of the d-mode transistor 102 between 0 volts and −12 volts. Accordingly, the circuitry 100 achieves a native d-mode device's superior switching performance and maintains a controllable edge rate, while preserving a cascode arrangement's inherent normally-off capability.

For turning off the d-mode transistor 102, the input node IN is cleared to the false state, so the output of the AND gate 120 has the false state, thereby turning off the PFET 134 and turning on the NFET 136. Likewise, in response to one or more of the detected fault conditions (irrespective of whether the input node IN is cleared to the false state or set to the true state), the output of the AND gate 120 has the false state, thereby turning off the PFET 134 and turning on the NFET 136. By turning on the NFET 136 in that manner, the gate of the d-mode transistor 102 is coupled through the NFET 136 to the line 132 whose voltage is −12 volts, so the d-mode transistor 102 is turned off.

For turning on the d-mode transistor 102, the input node IN is set to the true state, so the output of the AND gate 120 has the true state (but only while the output of the AND gate 108 likewise has the true state), thereby turning on the PFET 134 and turning off the NFET 136. By turning on the PFET 134 in that manner:

(a) the gate of the d-mode transistor 102 is coupled through the PFET 134 to the ground node GND (and likewise to the source of the LV switch 104) whose voltage is 0 volts, so $V_{GS}$ of the d-mode transistor 102 is approximately equal to (but opposite polarity from) $V_{DS}$ of the LV switch 104; and (b) accordingly, if the LV switch 104 is turned on, then $V_{DS}$ of the LV switch 104 is relatively small, and $V_{GS}$ of the d-mode transistor 102 is relatively small, so the d-mode transistor 102 is turned on.

If the driver circuitry 105 is unpowered, then the LV switch 104 is turned off, and the gate of the d-mode transistor 102 is coupled to near 0 volts (of the ground node GND) through the diode 138. Or, if the driver circuitry 105 has power, yet any one or more of the +12 V, +5 V or −12 V nodes is not at its suitable voltage level, then the signal from the UVLO circuitry 106 on the PGOOD line has a binary logic 0 ("false") state, so the LV switch 104 is turned off. If the LV switch 104 is turned off (such as for safety in response to one or more of the detected fault conditions), then \T$_{DS}$ of the LV switch 104 increases, which eventually causes $V_{GS}$ of the d-mode transistor 102 to reach (and continue beyond) its threshold voltage ($V_T$), so the d-mode transistor 102 begins (and continues) turning off, even if the line 132 is not at its suitable voltage level of −12 volts.

Modifications are possible in the described embodiments, and other embodiments are possible, within the scope of the claims.

What is claimed is:

1. A driver circuit comprising:
   (a) a negative voltage node, a reference voltage node, and an IN node;
   (b) a depletion mode transistor having a d-mode drain, having a d-mode source, and having a d-mode gate;
   (c) an enhancement mode transistor having an e-mode drain coupled to the d-mode source, having an e-mode source coupled to the reference node, and having an e-mode gate;
   (d) fault circuitry having a first fault output coupled to the e-mode gate and having a second fault output;
   (e) first logic circuitry having an input coupled to the IN node, having an input coupled to the second fault output, and having a gated IN output;
   (f) level shift circuitry having an input coupled to the gated IN output and having a first negative voltage output and having a second negative voltage output;
   (g) first and second drive transistors coupled between the negative voltage node and the reference voltage node, having drains coupled together and coupled to the d-mode gate, having a first gate coupled to the first negative voltage output, and having a second gate coupled to the second negative voltage output; and
   (h) a diode having a first terminal coupled to the d-mode gate and a second terminal coupled to the reference voltage node.

2. The driver circuit of claim 1 including latch circuitry having:
   (a) a first latch input coupled to the first negative voltage output;
   (b) a second latch input coupled to the second negative voltage output;
   (c) a first negative voltage latch output coupled to the first gate; and
   (d) a second negative voltage latch output coupled to the second gate.

3. The driver circuit of claim 2 in which the level shift circuitry is first level shift circuitry and the latch circuitry includes:
   (a) a first logic gate having a first input coupled to the first latch input, having a second input, and having an output coupled to the first negative latch output;
   (b) a second logic gate having a first input coupled to the second latch input, having a second input, and having an output coupled to the second negative latch output; and
   (c) second level shift circuitry having a first output coupled to the second negative latch output and to the second input of the first logic gate, and having a second output coupled to the first negative latch output and to the second input of the second logic gate.

4. The driver circuit of claim 3 including:
   (a) a first inverter having an input coupled to the first negative voltage output and having a first inverted output coupled to the first latch input; and
   (b) a second inverter having an input coupled to the second negative voltage output and having a second inverted output coupled to the second latch input.

5. The driver circuit of claim 3 including:
   (a) a first buffer having an input coupled to the first negative voltage latch output and having a buffer output coupled to the first gate; and
   (b) a second buffer having an input coupled to the second negative voltage latch output and having a buffer output coupled to the second gate.

6. The driver circuit of claim 3 in which the first logic gate is an OR gate and the second logic gate is an AND gate.

7. The driver circuit of claim 1 in which the reference voltage is 0 volts, the first negative voltage output has output signals of −5 volts and 0 volts, and the second negative voltage output has output signals of −12 volts and −7 volts.

8. The driver circuit of claim 1 in which the fault circuitry includes:
   (a) protection circuitry having an input coupled to the d-mode source and the e-mode drain, having an input coupled to the e-mode gate, and having a /fault output; and
   (b) protect logic circuitry having an input coupled to the /fault output and having the output coupled to the e-mode gate.

9. The driver circuit of claim 8 in which the protection circuitry is over-current protection and over-temperature protection circuitry.

10. The driver circuit of claim 1 in which the fault circuitry includes:
    (a) lock out circuitry having an input coupled to a positive voltage node, having an input coupled to the negative voltage node, and having a pgood output; and
    (b) lock out logic circuitry having an input coupled to the pgood output and having the second fault output.

11. The driver circuit of claim 1 in which the fault circuitry includes:
    (a) protection circuitry having an input coupled to the d-mode source and the e-mode drain, having an input coupled to the e-mode gate, and having a /fault output; and
    (b) protect logic circuitry having a first input coupled to the /fault output, having a second input, and having the output coupled to the e-mode gate;
    (c) lock out circuitry having an input coupled to a positive voltage node, having an input coupled to the negative voltage node, and having a pgood output coupled to the second input of the protect logic circuitry; and (d) lock out logic circuitry having a first input coupled to the pgood output, having a second input coupled to the /fault output, and having the second fault output.

12. The driver circuit of claim 11 in which the protection circuitry is an over voltage and over temperature protection circuit.

13. The driver circuit of claim 11 in which the lock out circuitry is an under voltage and over voltage lock out circuit.

14. The driver circuit of claim 1 in which the d-mode drain is coupled to an output voltage.

15. The driver circuit of claim 1 in which the d-mode drain is coupled to an output voltage of up to 600 volts.

16. The driver circuit of claim 1 in which the reference voltage node is a ground node.

17. The driver circuit of claim 1 in which the reference voltage node is a local ground node.

18. The driver circuit of claim 1 in which the depletion mode transistor is a gallium nitride high-electron mobility transistor.

19. The driver circuit of claim 1 in which the enhancement mode transistor is an N-channel field effect transistor.

20. A driver circuit comprising:
(a) a negative voltage node, a ground voltage node, an IN node, a depletion mode gate output, and an enhancement mode gate output;
(c) fault circuitry having a first fault output coupled to the enhancement mode gate output and having a second fault output;
(e) first logic circuitry having an input coupled to the IN node, having an input coupled to the second fault output, and having a gated IN output;
(f) level shift circuitry having an input coupled to the gated IN output and having a first negative voltage output and having a second negative voltage output;
(g) first and second drive transistors coupled between the negative voltage node and the reference voltage node, having drains coupled together and coupled to the depletion mode gate output, having a first gate coupled to the first negative voltage output, and having a second gate coupled to the second negative voltage output; and
(h) a diode having a first terminal coupled to the depletion mode gate output and a second terminal coupled to the ground voltage node.

21. The driver circuit of claim 20 including latch circuitry having:
(a) a first latch input coupled to the first negative voltage output;
(b) a second latch input coupled to the second negative voltage output;
(c) a first negative voltage latch output coupled to the first gate; and
(d) a second negative voltage latch output coupled to the second gate.

22. The driver circuit of claim 21 in which the level shift circuitry is first level shift circuitry and the latch circuitry includes:
(a) a first logic gate having a first input coupled to the first latch input, having a second input, and having an output coupled to the first negative latch output;
(b) a second logic gate having a first input coupled to the second latch input, having a second input, and having an output coupled to the second negative latch output; and
(c) second level shift circuitry having a first output coupled to the second negative latch output and to the second input of the first logic gate, and having a second output coupled to the first negative latch output and to the second input of the second logic gate.

23. The driver circuit of claim 22 including:
(a) a first inverter having an input coupled to the first negative voltage output and having a first inverted output coupled to the first latch input; and
(b) a second inverter having an input coupled to the second negative voltage output and having a second inverted output coupled to the second latch input.

24. The driver circuit of claim 22 including:
(a) a first buffer having an input coupled to the first negative voltage latch output and having a buffer output coupled to the first gate; and
(b) a second buffer having an input coupled to the second negative voltage latch output and having a buffer output coupled to the second gate.

25. The driver circuit of claim 22 in which the first logic gate is an OR gate and the second logic gate is an AND gate.

26. The driver circuit of claim 22 in which the reference voltage is 0 volts, the first negative voltage output has output signals of −5 volts and 0 volts, and the second negative voltage output has output signals of −12 volts and −7 volts.

27. The driver circuit of claim 20 in which the fault circuitry includes:
(a) protection circuitry having an input coupled to the d-mode source and the e-mode drain, having an input coupled to the e-mode gate, and having a /fault output; and
(b) protect logic circuitry having an input coupled to the /fault output and having the output coupled to the e-mode gate.

28. The driver circuit of claim 27 in which the protection circuitry is over-current protection and over-temperature protection circuitry.

29. The driver circuit of claim 20 in which the fault circuitry includes:
(a) lock out circuitry having an input coupled to a positive voltage node, having an input coupled to the negative voltage node, and having a pgood output; and
(b) lock out logic circuitry having an input coupled to the pgood output and having the second fault output.

30. The driver circuit of claim 29 in which the lock out circuitry is under voltage lock out circuitry.

31. The driver circuit of claim 20 in which the fault circuitry includes:
(a) protection circuitry having an input coupled to the d-mode source and the e-mode drain, having an input coupled to the e-mode gate, and having a /fault output; and
(b) protect logic circuitry having a first input coupled to the /fault output, having a second input, and having the output coupled to the e-mode gate;
(c) lock out circuitry having an input coupled to a positive voltage node, having an input coupled to the negative voltage node, and having a pgood output coupled to the second input of the protect logic circuitry; and
(d) lock out logic circuitry having a first input coupled to the pgood output, having a second input coupled to the /fault output, and having the second fault output.

32. The driver circuit of claim 31 in which the protection circuitry is an over voltage and over temperature protection circuit.

33. The driver circuit of claim 20 in which the lock out circuitry is an under voltage and over voltage lock out circuit.

34. The driver circuit of claim 20 in which the d-mode drain is coupled to an output voltage.

35. The driver circuit of claim 20 in which the d-mode drain is coupled to an output voltage of up to 600 volts.

36. The driver circuit of claim 20 in which the reference voltage node is a ground node.

37. The driver circuit of claim 20 in which the reference voltage node is a local ground node.

38. The driver circuit of claim 20 in which the fault circuit includes a protection input, and including:
   (a) a protection node coupled to the protection input;
   (b) a depletion mode transistor having a gate coupled to the depletion mode gate output, having a drain coupled to a voltage output, and having a source coupled to the protection node; and
   (c) an enhancement mode transistor having a gate coupled to the enhancement mode gate output, having a drain coupled to the source of the depletion mode transistor, and having a source coupled to the ground voltage node.

39. The driver circuit of claim 38 in which the depletion mode transistor is a gallium nitride high-electron mobility transistor.

40. The driver circuit of claim 38 in which the enhancement mode transistor is an N-channel field effect transistor.

\* \* \* \* \*